(12) United States Patent
Tian et al.

(10) Patent No.: US 9,123,619 B2
(45) Date of Patent: Sep. 1, 2015

(54) METHOD FOR INHIBITING THE ELECTRIC CROSSTALK OF BACK ILLUMINATED CMOS IMAGE SENSOR

(71) Applicant: SHANGHAI HUALI MICROELECTRONICS CORPORATION, Shanghai (CN)

(72) Inventors: Zhi Tian, Shanghai (CN); QiuMin Jin, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 14/098,017

(22) Filed: Dec. 5, 2013

(65) Prior Publication Data

US 2014/0302630 A1 Oct. 9, 2014

(30) Foreign Application Priority Data

Apr. 8, 2013 (CN) .......................... 2013 1 0120010

(51) Int. Cl.
*H01L 21/00* (2006.01)
*H01L 27/146* (2006.01)

(52) U.S. Cl.
CPC .... *H01L 27/14689* (2013.01); *H01L 27/14609* (2013.01)

(58) Field of Classification Search
CPC ..................... H01L 27/1464; H01L 27/14698; H01L 27/148

USPC ..................................................... 438/60, 144
See application file for complete search history.

(56) References Cited

U.S. PATENT DOCUMENTS

| 8,628,990 | B1 * | 1/2014 | Wu et al. .......................... 438/48 |
| 2010/0207230 | A1 * | 8/2010 | Hsu et al. ....................... 257/446 |
| 2013/0001722 | A1 * | 1/2013 | Chen et al. ..................... 257/432 |
| 2013/0256822 | A1 * | 10/2013 | Chen et al. ..................... 257/443 |
| 2013/0264668 | A1 * | 10/2013 | Chang et al. ................... 257/431 |

FOREIGN PATENT DOCUMENTS

| CN | 101752394 | 6/2010 |
| CN | 103139497 | 6/2013 |

* cited by examiner

*Primary Examiner* — Caridad Everhart
(74) *Attorney, Agent, or Firm* — Bennett Jones LLP

(57) ABSTRACT

The present invention discloses a method for inhibiting the electric crosstalk of back illuminated CMOS image sensor. This invention comprises, two ion implanting layers are implanted at the different area of the backside of the pixel unit after the thickness of the backside of CMOS image sensor is reduced. The ion concentrations implanted into the two layers are controlled to decrease progressively from top to bottom. An electric field is formed from top to bottom inside the epitaxial layer. The said electric field absorbs the incident light which arrives at the substrate region outside of the space charge of the photodiode. It reduces the electron diffuses in different pixels. Consequently, it reduces the electric crosstalk of pixels, improves the manufacture process and improve the image quality of the of CMOS image sensor.

6 Claims, 2 Drawing Sheets

METHOD FOR INHIBITING THE ELECTRIC CROSSTALK OF BACK ILLUMINATED CMOS IMAGE SENSOR

CROSS-REFERENCE TO RELATED APPLICATIONS

The present application claims priority under the Paris Convention to Chinese application number CN 201310120010.4, filed on Apr. 8, 2013, the disclosure of which is herewith incorporated by reference in its entirety.

FIELD OF THE INVENTION

The present invention relates to the field of CMOS image sensor, more specifically, it relates to a method for inhibiting the electric crosstalk of back illuminated CMOS image sensor.

BACKGROUND OF THE INVENTION

CMOS image sensor belongs to the optoelectronic components. The manufacturing process of CMOS image sensor is compatible with the manufacturing process of integrated circuit. CMOS image sensor is better than the charge coupled device ("CCD", hereinafter) in lower power consumption, faster, cheaper, larger bandwidth and so on. CMOS image sensor has become very popular in image sensor field. The driver circuit and the pixel are jointly integrated in CMOS image sensor, which simplified the design of hardware and reduced the consumption of the system power. CMOS image sensor can capture the signals of light and electrical simultaneously, and can further deal with the information of images in real time, whose speed is faster than that of CCD image sensor. Further more, CMOS image sensor has the characteristics of low cost, wide bandwidth, anti fuzzy, flexible access and the larger filling factor. Therefore, CMOS image sensor is widely used in the industrial automation control, the consumer electronics and other products, such as monitors, video communication products, toys and so on. The research and the development in CIS (CMOS image sensor) are to realize the multi-function and the intelligent with the advantage of system integration. The high frame rate of CIS can be achieved by the advantage of flexible access, i.e., it only reads the needed region of photo-surface. Moreover, the technologies of the wide dynamic range, the high resolution and the low noise are being developed.

FIG. 1 is the diagram of the 4 T active CMOS image sensor. There is a structure of shallow isolation trench around the active region of the P-type epitaxial layer. An N-type Doped Region 104 provided with photodiode is formed in the active region, which is located at the top of the active region. There is a P-well-region 107 in the active region, which is close to the N-type Doped Region 104. A Floated First N-type Region 109 and a Floated Second N-type Region 108 are formed at the top of P-well-region 107. A gate oxide and a gate which is disposed on the gate oxide are formed above the P-well-region which is between the first N-type Region 109 and the N-type Doped Region 104, consequently, a Transfer Transistor 110 is formed. There is a gate oxide and a gate which is disposed on the gate oxide are formed above the P-well-region which is between the first N-type Region 109 and the second N-type Region 108, consequently, a Reset Transistor 111 is formed. An amplifier transistor and a select transistor are formed in the active region. The N-well-region 109 is electrically connected to the gate of the amplifier transistor. The amplifier transistor and the select transistor are connected in series, and the two ends of the amplifier transistor are connected with the power supply voltage VDD and the select transistor severally. The second N-type Region 108 is in the potential of supply voltage. Ions are implanted into the exposed back of the P-type epitaxial layer. If the exposed back of the P-type epitaxial layer is regarded as the first surface in the ion implantation, it is defined that the closer the doped ions are from the front of the P-type epitaxial layer, the more deeply the doped ions implanted. As a reference, the implanted depth of implantation of the first doped ions is deeper than that of the second doped ions. Therefore, the first doped ions need more energy for support.

In order to remove the electronic of photodiode and the floating points, the transfer transistor and the reset transistor are switched on before lighting. When in lights, the charge will be generated in the N− of the photodiode, and Transfer Transistor 110 is switched off at this time. Then Transfer Transistor 110 is switched on. As there are some charges in the photodiode, the charge will be transported into the floating nodes. Then, the transfer transistor is switched off and waits for the next beam of light. Then the electrical signal of floating nodes is used to adjust the amplifier transistor. The reset transistor with a reset gate will reset the floating points to a reference voltage after read out. For CMOS image sensor of FSI (front side illumination), the light will pass through a dielectric layer and a metal stack layer, and this will reduce the efficiency of light. People had created a method for reducing the distance between light and the photodiode, i.e., the BSI-CIS (backside illuminated photo CMOS image sensor). The light can reach the photodiode directly. Therefore, the efficiency of light is improved, and the crosstalk is reduced caused by the reflecting light or the optical absorption of the metal layer and the dielectric layer. However, as the light gets into the backside of the CMOS image sensor directly. Therefore, there is no metal barrier blocking the light. In another word, the light will through the silicon substrate directly. That leads to the electron diffusion. The photoproduction electron will get into the substrate when the light is strong, and also will cause the crosstalk among the pixels. When the light reaches the substrate, which is the outside of the charge region of photodiode. The diffused electrons will be absorbed by the charge region in substrate. However, because of the irregularity of the electron diffusion, they can combine with the holes in the substrate, or walk for a while in the substrate. The electrons perhaps get into the other region of charge. Therefore, it causes a new crosstalk among the pixels. This is called the electric crosstalk. The electric crosstalk will also bring some false signals to pixels, and reducing the SNR (signal to noise ratio), which means the quality of image will be poor. When in the strong light, the problem of electric crosstalk will be very serious. The photoproduction electron, which is generated in the outside of charge region of the photodiode, will diffuse into the substrate, further, the electron which has been collected by the charge region will diffuse into the substrate once again. That causes some defects in imaging, just like a halo. The reason is that the number of the electrons that the pixels can accommodate is limited, and the P-N junction will come into balance from reverse biased by collecting enough electrons. The excess electrons will overflow and diffusion into the substrate, wherein most of them will be absorbed by the neighboring pixels, then the brightness of surrounding pixel will be increased, so the halo is formed, and the imaging quality of CMOS image sensor is affected.

Chinese Patent (CN 101752394 A) has disclosed a method of manufacturing the back illuminated CMOS image sensor. Firstly, an assembly of back illuminated type image sensor is formed in the front of the array. Then, the doped layer is implanted into the backside of the CMOS image sensor. The doped layer can establish the gradient of dopant, and promote the migration of the photo-generated electrons migrating to the front of the array. FIG. 2 is the schematic diagram of the BSI (backside illumination) structure, which has been treated by the latter process. The photodiode which is doped at the back is annealed. The untreated region can capture the diffusion electrons in the substrate, for inhibiting the halo. The above method can utilize the doped layer which is not activated to capture the electrons diffused into the substrate; the phenomena of halo in strong light can be improved. However, the unactivated doped layer is unstable, and the number of unactivated electron is restricted. Hence, the unactivated region will lose the ability of capturing the electron when exposed in lights for a short time, and the electrons will spread to other regions. Consequently, the image quality of CMOS image sensor will be damaged.

Chinese Patent (CN 103139497A) has disclosed an active pixel of a complementary metal oxide semiconductor (CMOS) image sensor. The active pixel at least comprises a photosensitive component which is placed inside a semiconductor substrate, a reset transistor and a source following transistor which are connected with the photosensitive component, a switch transistor, and a row positioning line. The pixel photosensitive component of the image sensor comprises two photosensitive regions, namely a low dose foreign ion injection region, and a high dose foreign ion injection region near the reset transistor. When in low illumination, photo-electricity charge generated in the photosensitive component is only collected in the high dose foreign ion injection region. The grain of photo-electricity transition is high, and sensitivity of the sensor is high. When in high illumination, photo-electricity charge generated in the photosensitive component is collected in the whole photosensitive component. Therefore, the active pixel can effectively improve the luminous sensitivity of the image sensor in the low illumination, and the sensor collects more real object detail information when in the low illumination.

The said invention comprises two ion implanting regions whose dosage of doped ions is different from each other. The image quality in strong light or weak light can be improved. However, the substrate in the above patent is a traditional substrate. Therefore, in the process of image acquisition, when the light is strong, there will be the photoelectric electrons diffused into the substrate, it causes the electric crosstalk among the pixels, consequently, the imaging quality of image is affected.

SUMMARY OF THE INVENTION

Due to the defects of the traditional art, the present invention discloses a method for inhibiting the electric crosstalk of back illuminated CMOS image sensor. Firstly, the thickness of the backside of CMOS image sensor is reduced, and then the different ion of different regions are implanted, in order to reducing the diffusion of electrons between different pixels in a substrate, and inhibiting the electric crosstalk of pixels which is caused by the diffusion of electrons.

In order to achieve the above purpose, the present invention comprises:

A method for inhibiting the electric crosstalk of back illuminated CMOS image sensor, wherein the said back illuminated CMOS image sensor includes a P-type substrate and a P-type epitaxial layer, the said P-type epitaxial layer covers the upper surface of the said P-type substrate, and a shallow trench isolation structure is formed around the active region of P-type epitaxial layer; besides, a N-type doped region which consists of a photodiode by heavily doped implanting is formed in the active region, wherein, the method consists of the following steps:

Step S1: the P-type substrate is removed by using a mask, in order to expose the back of the said P-type epitaxial layer;

Step S2: a photoresist layer is coated on the parts of the back of P-type epitaxial layer; the photoresist is in alignment with the photodiode, and aiming at the N-type doped region of the photodiode, the photoresist is then treated by the process of exposing and developing, then parts of the photoresist is remained at the back of the P-type epitaxial layer, which is used as a mask layer in the ion implant process;

Step S3: first ions are implanted into the exposed back of the P-type epitaxial layer, and a first ion implanted layer is formed in the P-type epitaxial layer having an interval with the back of P-type epitaxial layer;

Step S4: the mask layer is etched to completely expose the back of the P-type epitaxial layer, and then second ions are implanted into the exposed back of the P-type epitaxial layer, which forms the second ion implanted layer between the back of the P-type epitaxial layer and the first ion implanted layer;

Step S5: the photoresist left at the back of the P-type epitaxial layer is removed, and then the P-type epitaxial layer is annealed.

According to the above method, wherein the quantity of the ions implanted into the first ion implanted layer is larger than that of the ions implanted into the second ion implanted layer, the concentration of the ions in the said first ion implanted layer is larger than that in the said second ion implanted layer.

According to the above method, wherein the energy of the ions for forming the first ion implanted layer is larger than that of the ions for forming the second ion implanted layer.

According to the above method, wherein the concentration of ions in the said first ion implanted layer and the said second ion implanted layer reduces successively from top to bottom.

According to the above method, wherein the said first ions are the indium ions and the said second ions are the boron ions.

According to the above method, wherein the back of the first ion implanted layer is in touch with the second ion implanted layer.

According to the above method, wherein there is a gap is in the first ion implanted layer, and this gap is in alignment with the N-type doped region.

The advantageous effects of the above technical solution are that as follows:

The above method can reduce the diffusion of electrons among the different pixels in the substrate effectively. This method can also reduce the electric crosstalk which is caused by the pixel diffusion of electrons. Further more, this method can improve the imaging quality of CMOS image sensor by preventing the halo which is caused by too much light induced electron diffusion into the substrate.

DETAILED DESCRIPTION OF THE PREFERRED EMBODIMENT

The present invention will be further illustrated in combination with the following figures and embodiments, but it should not be deemed as limitation of the present invention.

Figure 1:
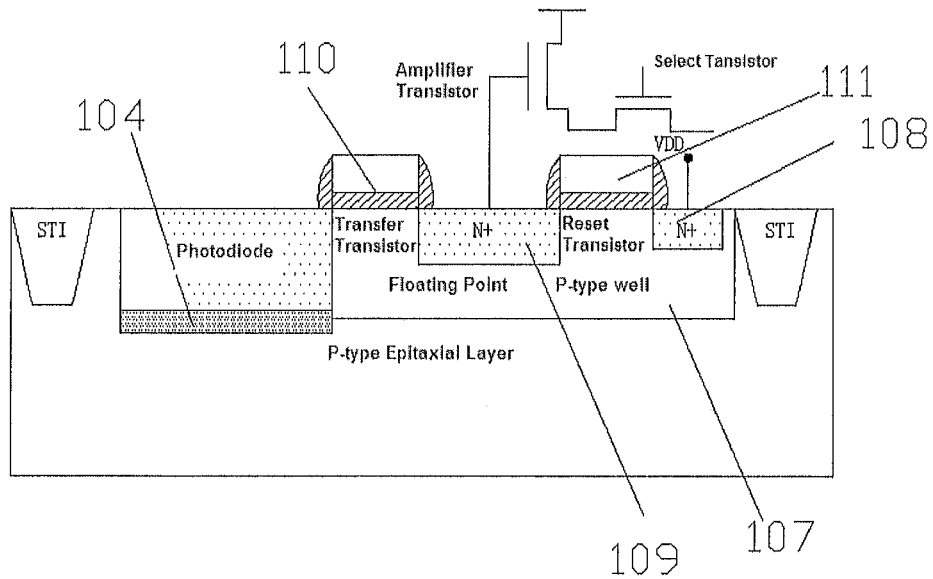
FIG. 1 is a diagram of 4 T active CMOS image sensor.
Figure 2:
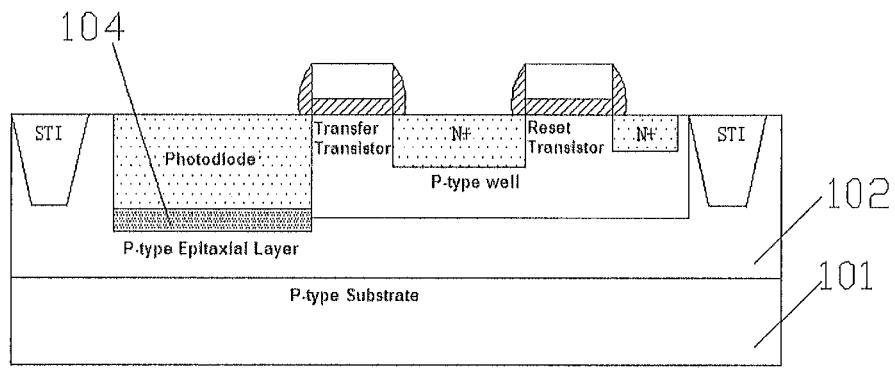
FIG. 2 is a diagram of BSI (backside illumination) structure of back illuminated CMOS image sensor in prior art.
Figure 3:
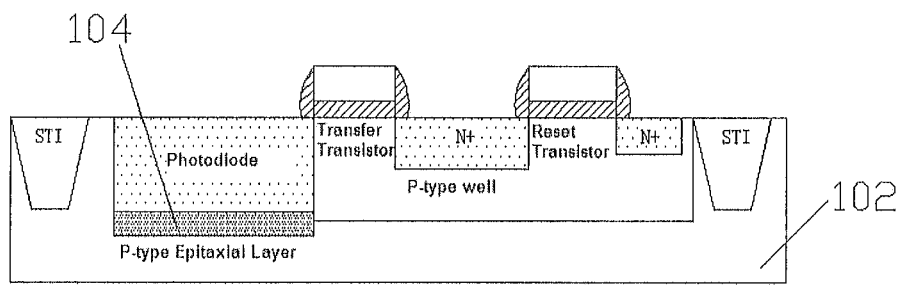
FIG. 3 is a diagram of the normal back illuminated CMOS image sensor, which is thinned by the present invention.
Figure 4:
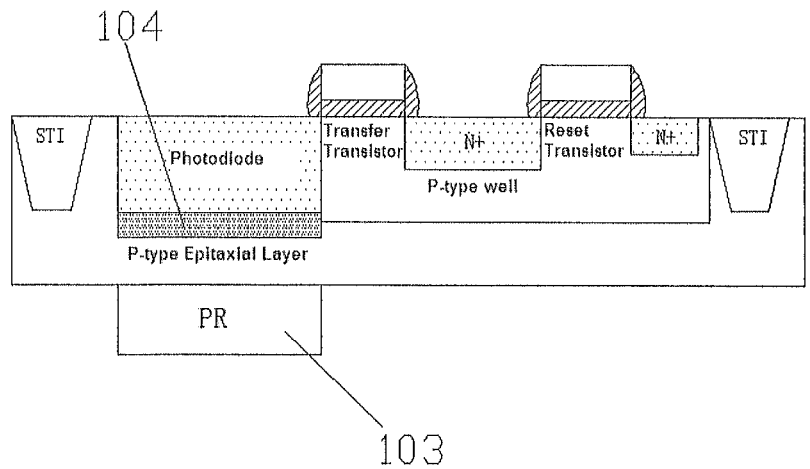
FIG. 4 is a diagram of the normal back illuminated CMOS image with a blocked mask layer.
Figure 5:
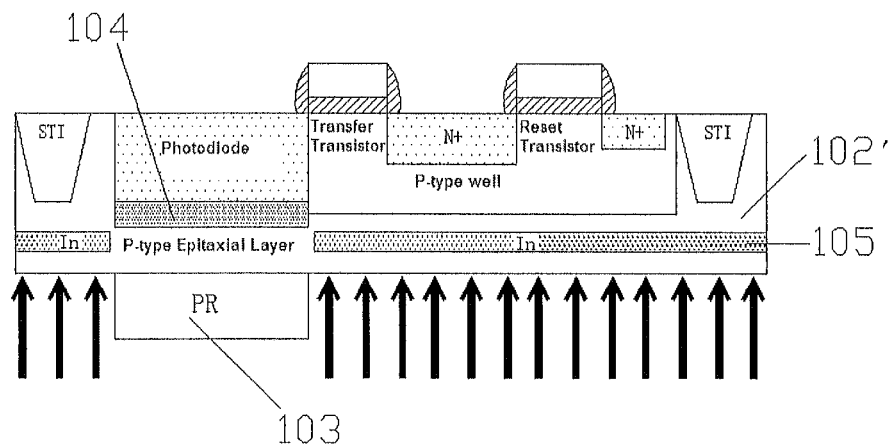
FIG. 5 is a diagram of the normal back illuminated CMOS image sensor, which is after the first ion implanted by the present invention.

FIGS. 3 to 6 are the flow diagrams of the method for inhibiting the electric crosstalk of back illuminated CMOS image sensor, the method includes the following steps:

Step S1: the P-type Substrate 101 is removed by using a mask, in order to expose the back of the P-type Epitaxial Layer 102, which forms the structure as shown in FIG. 3;

Step S2: a photoresist layer is coated on the parts of the back of P-type epitaxial layer. The photoresist is in alignment with the photodiode, and aiming at the N-type Doped Region 104 of the photodiode. The photoresist is then treated by the process of exposing and developing, then parts of the photoresist is remained at the back of the P-type Epitaxial Layer 102, which is used as a Mask Layer 103 in the ion implanting process, the structure as shown in FIG. 4 is formed;

Step S3: the indium ions are implanted into the exposed back of the P-type epitaxial layer, and Indium Ion Implanted Layer 105 is formed in the P-type epitaxial layer having an interval with the back of the P-type epitaxial layer. As parts of the back of the P-type Epitaxial Layer 102' is covered by the Mask Layer 103, there is a gap in the indium ion implanted layer, and the gap is in alignment with the N-type Doped Region 104, then the structure as shown in FIG. 5 is formed.

Figure 6:
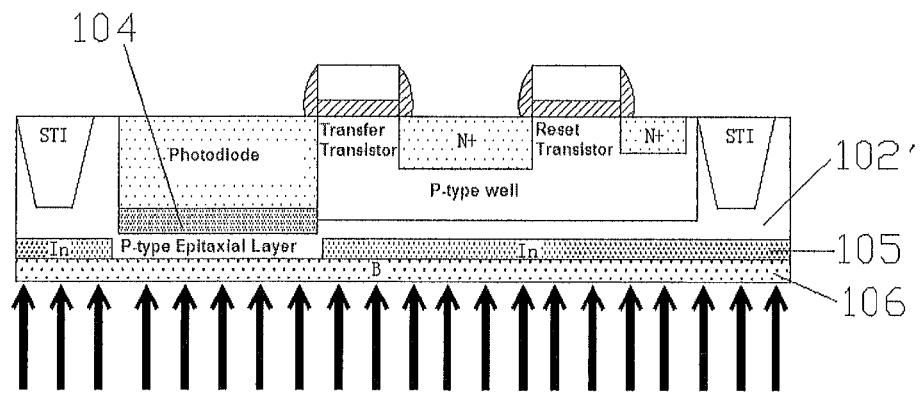
FIG. 6 is a diagram of the normal back illuminated CMOS image sensor, which is after the second ion implanted by the present invention.

Step S4: the mask layer is removed to completely expose the back of the P-type Epitaxial Layer 102', and then the boron ions are implanted into the exposed back of the P-type epitaxial layer, which forms the boron ion implanted layer between the back of the P-type epitaxial layer and the indium ion implanted layer. The structure as shown in FIG. 6 is formed. The energy of the ions for forming the indium ion implanted layer is larger than that of the ions for forming the boron ion implanted layer. The ionic concentration of the Indium Ion Implanted Layer 105 is larger than that of Boron Ion Implanted Layer 106. In an embodiment of the present invention, the energy of the indium ions which are implanted into the P-type epitaxial layer are controlled in the range from 80 KeV to 120 KeV, and the ionic concentration of indium ions is controlled in the range from $8 \times 1011/cm2$ to $10 \times 1012/cm2$. The energy of the boron ions which are implanted into the P-type epitaxial layer is controlled in the range of 30 KeV to 100 KeV. The ionic concentration of boron ions are controlled in the range of $8 \times 1011/cm2$ to $10 \times 1012/cm2$. As the ionic concentration of Indium Ion Implanted Layer 105 is larger than that of Boron Implanted Layer 106, the concentration of ions in Indium Ion Implanted Layer 105 and the boron ion implanted layer reduces successively from top to bottom. And because of the P-type region whose ionic concentration decreases from top to bottom, a electric field is formed out of the photodiode region whose orientation is from top to bottom. This electric field can absorb the electrons which are produced by the effect of photoelectric when light reaches the substrate, so the diffusion of electrons with different pixels of different regions from the backside of substrate is formed, further more, the crosstalk of electrons is reduced, in another words, the halation is prevented, and this halation is caused by too much numbers of photoelectrons diffuse into the substrate in strong light.

Step S5: the remaining photoresist is removed from the back of the P-type epitaxial layer, and then the P-type epitaxial layer is annealed. The P-type epitaxial layer is annealed after being implanted with ions for every time. Therefore, there will not be defects at the surface of the P-type epitaxial layer. Further more, the electric field can capture the electrons for a long time and inhibit the electric crosstalk of substrate. As a result, the imaging quality of the CMOS image sensor is improved.

In conclusion, the method for inhibiting the electric crosstalk of back illuminated CMOS image sensor in the present invention, utilizing the way of forming two doped layers which are different from each other at the back of the CMOS image sensor. As the doped concentration of the photodiode and doped concentration of the STI are inequality, an electric field is formed. Due to the electric field the photo generated electrons get into the photodiode, the probability of these photo generated electrons getting into the surrounding pixel unit is reduced. The electric crosstalk of pixels is reduced, the halo which is formed by too much numbers of photoelectrons caused by the strong light diffused into the substrate of the back illuminated CMOS image sensor is avoided. The defects of sensor surface are also eliminated by the annealing process. Further more, the electric field can continuously capture the electrons, so the electric crosstalk of substrate is inhibited. As a result, the imaging quality of the CMOS image sensor is improved.

Although a typical embodiment of a particular structure of the specific implementation way has been given with the above description and the figures, it is appreciated that other changes based on the spirit of this invention may also be made. Though the preferred embodiments are proposed above, these contents will never be the limitation of this invention.

It is obvious for the skilled in the art to make varieties of changes and modifications after reading the above descriptions. Hence, the Claims attached should be regarded as all the changes and modifications which cover the real intention and the range of this invention. Any and all equivalent contents and ranges in the range of the Claims should be regarded belonging to the intention and the range of this invention.

The invention claimed is:

1. A method for inhibiting the electric crosstalk of back illuminated CMOS image sensor, wherein the said back illuminated CMOS image sensor includes a P-type substrate and a P-type epitaxial layer, the said P-type epitaxial layer covers the upper surface of the said P-type substrate, and a shallow trench isolation structure is formed around the active region of P-type epitaxial layer; besides, a N-type doped region which consists of a photodiode by heavily doped implanting is formed in the active region, wherein, the method consists of the following steps:

Step S1: the P-type substrate is removed by using a mask, in order to expose the back of the said P-type epitaxial layer;

Step S2: a photoresist layer is coated on the parts of the back of P-type epitaxial layer; the photoresist is in alignment with the photodiode, and aiming at the N-type doped region of the photodiode, the photoresist is then treated by the process of exposing and developing, then parts of the photoresist is remained at the back of the P-type epitaxial layer, which is used as a mask layer in the ion implanting process;

Step S3: first ions are implanted into the exposed back of the P-type epitaxial layer, and a first ion implanted layer is formed in the P-type epitaxial layer having an interval with the back of P-type epitaxial layer, wherein a gap is formed in the first ion implanted layer during implantation of first ions due to that parts of the back of the said P-type epitaxial layer is covered by the said mask layer, and this gap is in alignment with the said N-type doped region;

Step S4: the mask layer is etched to completely expose the back of the P-type epitaxial layer, and then second ions are implanted into the exposed back of the P-type epitaxial layer, which forms the second ion implanted layer between the back of the P-type epitaxial layer and the first ion implanted layer;

Step S5: the photoresist left at the back of the P-type epitaxial layer is removed, and then the P-type epitaxial layer is annealed.

2. The method according to claim 1, wherein the quantity of the ions implanted into the first ion implanted layer is larger than that of the ions implanted into the second ion implanted layer, the concentration of the ions in the said first ion implanted layer is larger than that in the said second ion implanted layer.

3. The method according to claim 1, wherein the energy of the ions for forming the first ion implanted layer is larger than that of the ions for forming the second ion implanted layer.

4. The method according to claim 1, wherein the concentration of ions in the said first ion implanted layer and the said second ion implanted layer reduces successively from top to bottom.

5. The method according to claim 1, wherein the said first ions are the indium ions and the said second ions are the boron ions.

6. The method according to claim 1, wherein the back of the first ion implanted layer is in touch with the second ion implanted layer.

\* \* \* \* \*